United States Patent [19]

Kim

[11] Patent Number: 5,771,140
[45] Date of Patent: Jun. 23, 1998

[54] ELECTRO-STATIC DISCHARGE AND LATCH-UP PREVENTION CIRCUIT

[75] Inventor: Dae Seong Kim, Kyungsangbook-do, Rep. of Korea

[73] Assignee: LG Semicon Co., Ltd., Cheongju, Rep. of Korea

[21] Appl. No.: 623,032

[22] Filed: Mar. 28, 1996

[30] Foreign Application Priority Data

Nov. 28, 1995 [KR] Rep. of Korea ................. 1995 44214

[51] Int. Cl.⁶ ..................................................... H02H 3/22
[52] U.S. Cl. ............................. 361/111; 361/56; 361/58; 361/118
[58] Field of Search .................................. 361/18, 56, 57, 361/58, 91, 118, 119, 127, 93

[56] References Cited

U.S. PATENT DOCUMENTS

| | | | |
|---|---|---|---|
| 4,484,244 | 11/1984 | Avery | 361/56 |
| 4,594,633 | 6/1986 | Townsend et al. | 361/57 |
| 4,724,471 | 2/1988 | Leuschner | 357/23.13 |
| 4,760,433 | 7/1988 | Young et al. | 357/23.13 |
| 5,212,616 | 5/1993 | Dhong et al. | 361/18 |
| 5,270,589 | 12/1993 | Sawada | 307/475 |
| 5,473,169 | 12/1995 | Her et al. | 361/91 |

*Primary Examiner*—Jeffrey A. Gaffin
*Assistant Examiner*—Stephen Jackson
*Attorney, Agent, or Firm*—Fleshner & Kim

[57] ABSTRACT

An improved electro-static discharge and latch-up prevention circuit capable of preventing circuit malfunctions caused by an electro-static discharge and permitting an integrated circuit, in which a bias condition is stable, to perform a signal input/output operation by applying an electro-static having a certain level having a limited range to the integrated circuit, which includes an electro-static discharge prevention unit provided in the interior of or at the outside of an integrated circuit and connected between a positive voltage and a negative voltage in series for preventing positive and negative electro-static discharges; a switching unit connected between the electro-static discharge prevention unit and the interior circuit of the integrated circuit chip for switching; and a control unit for outputting a control signal so as to control a switching operation of the switching unit.

20 Claims, 4 Drawing Sheets

TRUTH TABLE

| $V_{DD}$ | $V_{SS}$ | CTL |
|---|---|---|
| L | L | H |
| L | H | H |
| H | L | L |
| H | H | H | ial
ELECTRO-STATIC DISCHARGE AND LATCH-UP PREVENTION CIRCUIT

BACKGROUND OF THE INVENTION

1. Field of the Invention

The present invention relates to an electro-static discharge and latch-up prevention circuit, and particularly to an improved electrostatic discharge and latch-up prevention circuit capable of preventing circuit malfunctions caused by an electrostatic discharge and permitting an integrated circuit, in which a bias condition is stable, to perform a signal input/output operation by applying an electrostatic having a certain level having a limited range to the integrated circuit.

2. Description of the Conventional Art

FIG. 1 shows a conventional electro-static discharge prevention circuit, which includes a PMOS transistor and an NMOS transistor 2 connected between a positive electric power Vdd and a negative electric power (or ground) Vss. The gate electrodes of the PMOS transistor 1 and the NMOS transistor 2 are commonly connected to itself source electrode, respectively. FIG. 2 shows an equivalent circuit of FIG. 1. Here, the PMOS transistor 1 plays a role of a positive electro-static discharge prevention diode D1, and the NMOS transistor 2 plays a role of a negative electrostatic discharge prevention diode D2. This electrostatic discharge prevention circuit may be provided in the interior of the integrated circuit or at the outside of the same. FIGS. 1 and 2 show an electro-static discharge prevention circuit provided in the interior of the integrated circuit chip. The electro-static discharge prevention circuit is disposed between a pad and an internal circuit of the integrated circuit chip. Meanwhile, FIG. 3 shows an electro-static discharge prevention circuit provided at the outside of the integrated circuit. The electro-static discharge prevention circuit is disposed between a pin connected thereto and an external circuit.

The operation of the conventional electro-static discharge prevention circuit will now be explained with reference to the accompanying drawings.

When a positive voltage Vdd and a negative voltage Vss are applied to the source electrodes of the PMOS transistor 1 and the NMOS transistor 2, and a positive electro-static voltage larger than that of the positive voltage Vdd is applied to the pad, the diode D1 is turned on, and the diode D2 is turned off. Therefore, the maximum voltage at the node N1 is limited to be a certain value which is obtained by adding the positive voltage Vdd and the threshold voltage Von,d1 of the diode D1. That is, the electric level of the node of which the maximum value is limited is transmitted to the interior circuit of the integrated circuit chip.

Meanwhile, when a negative electro-static voltage smaller than that of the negative voltage Vss is applied to the pad, the diode D2 is turned on, and the diode D1 is turned off. Therefore, the minimum voltage at the node N1 is limited to be a certain value that is obtained by subtracting the threshold voltage Von, d2 of the diode D2 from the negative voltage Vss. That is, the electric level at the node N1 of which its minimum value is limited is transmitted to the interior circuit of the integrated circuit.

Therefore, although a larger positive or smaller negative electro-static voltage is applied to the system from the pad, a certain electric level which is below a certain level or exceeds a certain level is transmitted to the interior circuit of the integrated circuit chip by the electro-static discharge prevention diodes D1 and D2, thus preventing integrated circuit malfunctions caused by electro-static discharges.

However, when a positive voltage Vdd and a negative voltage Vss are not applied to the circuit, when a larger positive electro-static voltage or a smaller negative electro-static voltage is applied to the pad, since the diodes D1 and D2 are not turned on, hundreds or thousands of voltage level are transmitted to the interior of the integrated circuit chip, so that the interior circuit of the integrated circuit chip is broken. In this case, the electro-static discharge prevention circuit cannot prevent the above-mentioned problems.

SUMMARY OF THE INVENTION

Accordingly, it is an object of the present invention to provide an electro-static discharge and latch-up prevention circuit, which overcome the problems encountered in a conventional electro-static discharge and latch-up prevention circuit.

It is another object of the present invention to provide an improved electro-static discharge and latch-up prevention circuit capable of preventing circuit malfunctions caused by an electro-static discharge and permitting an integrated circuit, in which a bias condition is stable, to perform a signal input/output operation by applying an electro-static having a certain level having a limited range to the integrated circuit.

To achieve the above objects, there is provided an electro-static discharge and latch-up prevention circuit, which includes an electro-static discharge prevention unit provided in the interior of or at the outside of an integrated circuit and connected between a positive voltage and a negative voltage in series for preventing positive and negative electro-static discharges; a switching unit connected between the electro-static discharge prevention unit and the interior circuit of the integrated circuit chip for switching; and a control unit for outputting a control signal so as to control a switching operation of the switching unit.

DETAILED DESCRIPTION OF THE INVENTION

Figure 1:
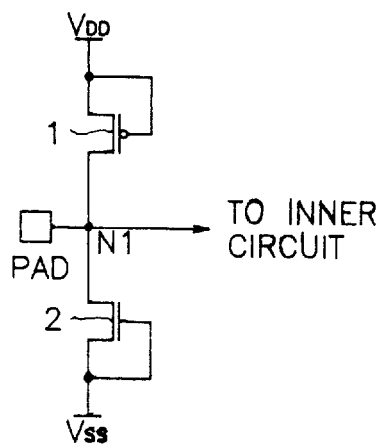
FIG. 1 is a circuit view of a conventional electro-static discharge prevention circuit of which the electro-static prevention circuit is provided within an integrated circuit chip.
Figure 2:
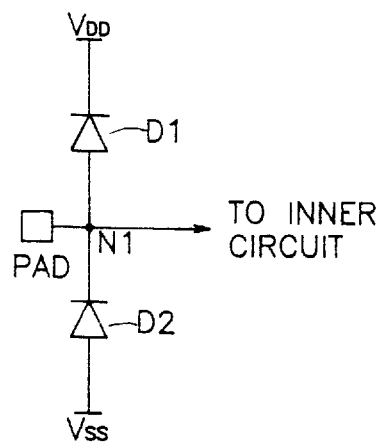
FIG. 2 is a circuit view of an equivalent circuit of FIG. 1.
Figure 3:
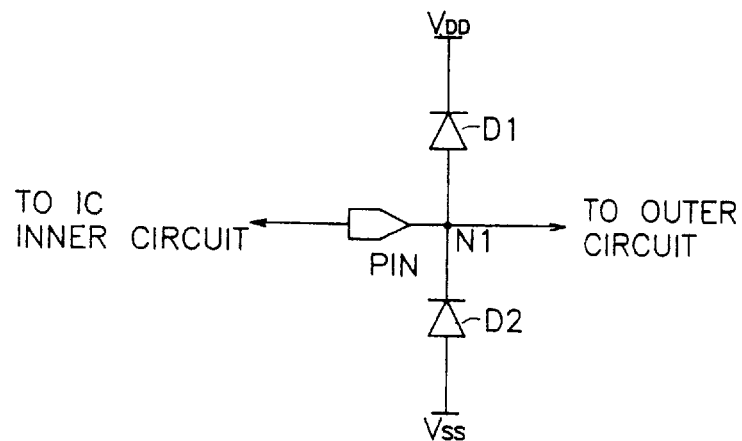
FIG. 3 is a circuit view of a conventional electro-static discharge prevention circuit of which an electro-static discharge prevention circuit is provided at the outside of the integrated circuit chip.
Figure 4:
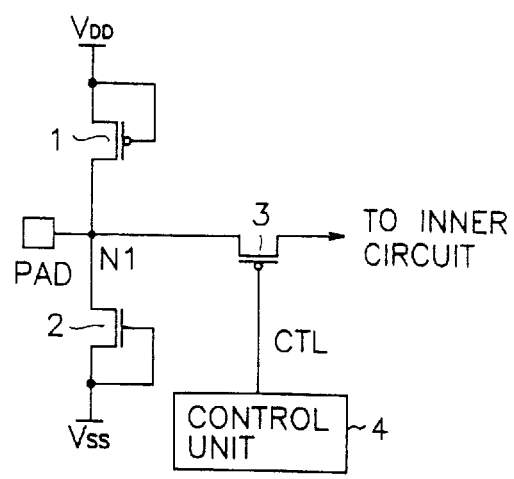
FIG. 4 is a circuit view of an integrated circuit having an electro-static discharge and latch-up prevention circuit according to the present invention.
Figure 5:
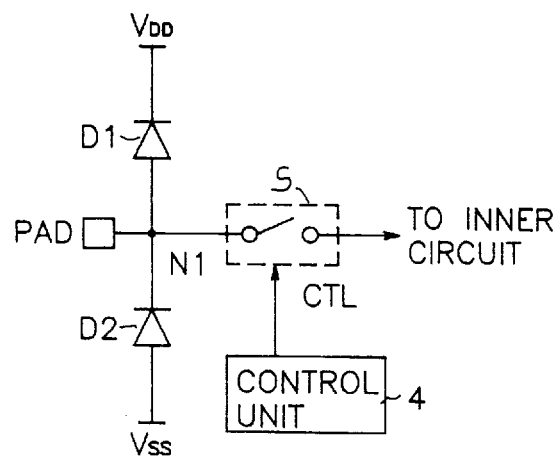
FIG. 5 is a circuit view of an equivalent circuit of FIG. 4 according to the present invention.

FIG. 4 shows an electro-static discharge and latch-up prevention circuit according to the present invention, which includes a PMOS transistor 3, which plays a switching role as a control signal CTL is applied to the gate electrodes of the PMOS transistor 1 and an NMOS transistor 2, disposed between a node N1 and the internal circuit of the integrated circuit. FIG. 4 shows an electro-static discharge and latch-up prevention circuit which is provided in the interior of the integrated circuit chip and FIG. 5 illustrates an equivalent circuit of FIG. 4.

The operation of the electro-static discharge and latch-up prevention circuit according to the present invention will now be explained with reference to the accompanying drawings.

To begin with, when a positive voltage VDD and a negative voltage Vss are applied to the source electrodes of the PMOS transistor 1 and the NMOS transistor 2, and when a positive eletro-static voltage larger than that of the positive voltage Vdd is applied to a pad, a diode D1 is turned on, and a diode D2 is turned off. Therefore, the maximum voltage at anode N1 is limited to be a certain value which is obtained by adding the positive voltage Vdd and the threshold voltage of the diode D1. This voltage of the node N1 of which the maximum value thereof is limited is applied to the interior circuit of the integrated circuit chip.

Meanwhile, when a negative electro-static voltage smaller than that of the voltage Vss is applied to the pad, the diode D2 is turned on, and the diode D1 is turned off. Therefore, the minimum voltage at the node 1 is a certain value which is obtained by subtracting the threshold voltage Von, d2 of the diode D2 from the negative voltage Vss. This voltage is applied to the interior circuit of the integrated circuit chip.

Therefore, although a larger positive electro-static voltage or a smaller negative electro-static voltage is applied from the pad, a certain level voltage, which is limited to be a certain by the electro-static discharge prevention diodes D1 and D2, is applied to the interior of the integrated circuit chip, thus preventing the integrated circuit chip from breakages caused by an electro-static discharge.

However, when the positive voltage Vdd and the negative voltage Vss are not applied to the source electrodes of the PMOS transistor 1 and the NMOS transistor 2, or when the same is applied to one of the source electrodes of the PMOS transistor 1 and the NMOS transistor 2, a high level control signal is applied to the gate electrode of the PMOS transistor 3. Therefore, the PMOS transistor 3 is turned off, and the interior circuit of the integrated circuit chip is electrically disconnected from the node N1. In this state, although a larger positive or smaller negative electro-static voltage is applied to the pad, since the electro-static voltage is not applied to the interior circuit of the integrated circuit chip due to the turned-off switch S, the breakages due to the electro-static discharge can be prevented.

Figure 6:
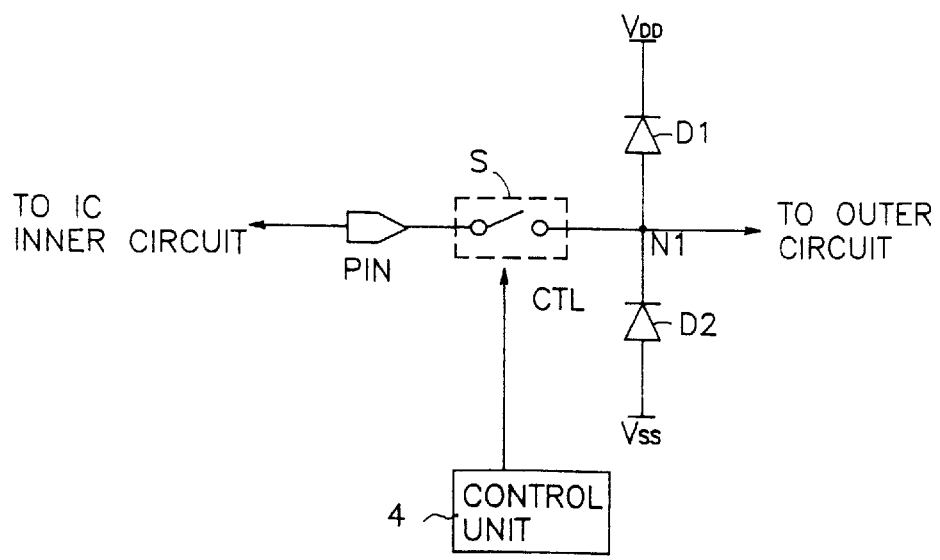
FIGS. 6 and 7 are circuit views of an electro-static discharge and latch-up prevention circuit which is provided at the outside of the integrated circuit according to the present invention.
Figure 7:
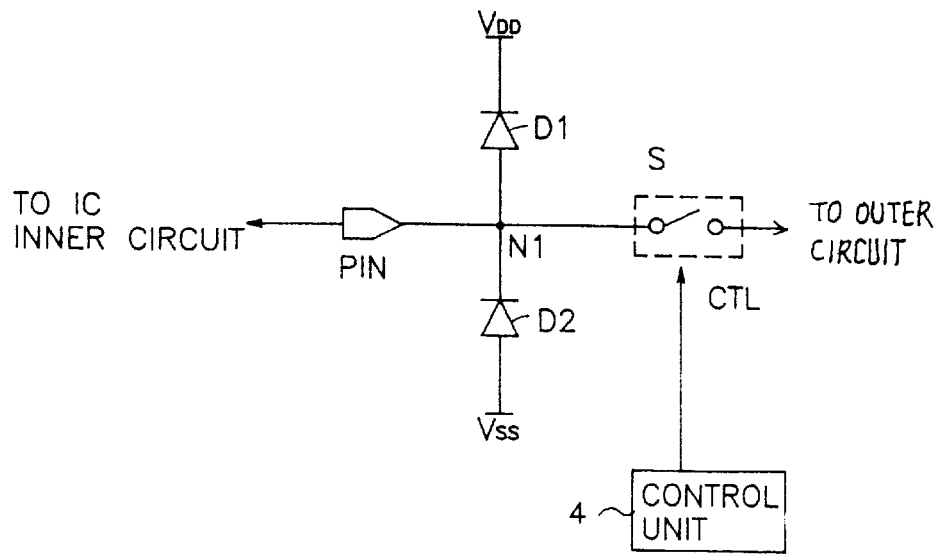

FIGS. 6 and 7 show an electro-static discharge and latch-up prevention circuit which is provided at the outside of the integrated circuit according to the present invention. That is, FIG. 6 shows a PMOS transistor 3 disposed between the pin of the integrated circuit chip and the node N1, and FIG. 7 shows a PMOS transistor 3 disposed between the node N1 and the external circuit. The operations of FIGS. 6 and 7 are the same as the operations of FIGS. 4 and 5.

Figure 8:
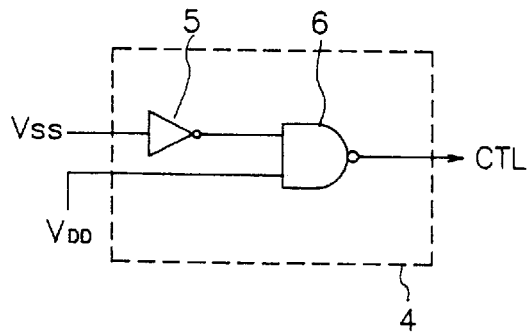
FIG. 8 is a truth table between a circuit construction of a control unit and an input/output signal of the same of FIGS. 4 through 7 according to the present invention.

FIG. 8 shows a truth table between a circuit construction of a control unit and an input/output signal of the same of FIGS. 4 through 7 according to the present invention, which consists of an inverter 5 for inverting a negative voltage Vss and a NAND-gate 6 for NANDing the output signal of the inverter 5 and the positive voltage Vdd.

As shown therein, the control unit 4 outputs a low level control signal CTL when the positive voltage Vdd is a high level and the negative voltage is a low level. Therefore, the PMOS transistor is turned on in accordance with a low level control signal applied thereto, and the electric voltage is applied to the interior circuit of the integrated circuit chip. However, when the positive voltage Vdd and the negative voltage Vss are not a high level and a low level, respectively, the control unit 4 outputs a high level control signal, and the PMOS transistor 3 is turned off. Therefore, the PMOS transistor 3 is electronically disconnected from the interior circuit of the integrated circuit.

However, when the PMOS transistor 3 is turned on, that is, when the positive voltage Vdd and the negative voltage Vss are a high level and a low level, respectively, the positive voltage Vdd and the negative voltage Vss are applied to the source electrodes of the PMOS transistor 1 and the NMOS transistor 2. At this time, since the electro-static of the positive and negative electro-static voltage are limited to a certain level by the PMOS transistor 1 and the NMOS transistor 2, although the electric level of the node N1 is applied to the interior circuit of the integrated circuit chip, the circuit is not broken by the electro-static discharge. However, when the PMOS transistor 3 is turned off, that is, nor the positive voltage Vdd and the negative voltage Vss or either the positive voltage Vdd or the negative voltage Vss is applied to the source electrodes of the PMOS transistor 1 and the NMOS transistor 2, the positive or negative electro-static voltage is not limited to a certain level. At this time, since the PMOS transistor 3 is electrically disconnected from the node N1, the electro-static discharge is not applied to the system, so that it is possible to prevent the circuit from the electro-static discharge.

In addition, the electro-static discharge and latch-up prevention circuit according to the present invention is directed to connecting the pad and pin and integrated circuit from one another after the voltages Vdd and Vss are applied thereto. That is, after the interior circuit of the integrated circuit chip has a stable bias condition in cooperation with the voltages Vdd and Vss, the signal input/output from the input/output pins is performed, thus preventing the latch-up.

As described above, the present invention is directed to preventing circuit malfunctions caused by an electro-static discharge and permitting an integrated circuit, in which a bias condition is stable, to perform a signal input/output operation by applying an electro-static having a certain level having a limited range to the integrated circuit.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. An electro-static discharge and latch-up prevention circuit, comprising:

electro-static discharge prevention means provided in the interior of or at the outside of an integrated circuit and connected between a positive voltage and a negative voltage in series for preventing positive and negative electro-static discharges;

switching means connected between said electro-static discharge prevention means and the interior circuit of said integrated chip for switching; and control means for outputting a control signal so as to control a switching operation of said switching means, wherein said control means includes an inverter that inverts the negative voltage to a positive voltage level and a logic-gate that logically combines the output signal of said inverter and the level of the positive voltage.

2. The circuit of claim 1, wherein said electro-static discharge prevention means is a PN conjunction diode.

3. The circuit of claim 1, wherein said electro-static discharge prevention means is a bipolar diode.

4. The circuit of claim 1, wherein said electro-static discharge prevention means is a MOS transistor.

5. The circuit of claim 4, wherein said MOS transistor includes a PMOS transistor and an NMOS transistor which are connected between the positive voltage and the negative voltage in series, wherein the gate electrodes of the PMOS transistor and the NMOS transistor are commonly connected to the source electrodes of the same, and the drain electrodes thereof are connected to each other.

6. The circuit of claim 1, wherein said control means is directed to outputting a control signal so that said switching means is operated when the electric levels of the positive voltage and the negative voltage are a certain level.

7. The circuit of claim 6, wherein the electric levels of said positive voltage and said negative voltage are a high level or a low level.

8. The circuit of claim 6, wherein said switching means is a MOS transistor.

9. The circuit of claim 6, wherein said logic gate is a NAND-gate.

10. A protection circuit comprising:
    a protection device that prevents at least one of positive and negative electro-static discharges, coupled for receiving at least one of a first prescribed potential and a second prescribed potential, and having a node that receives a first signal;
    a switch having first and second electrodes, the first electrode being coupled to the node; and
    a control circuit coupled to said switch such that a switching operation of said switch is controlled for coupling the first electrode to the second electrode of said switch, wherein said control circuit includes an inverter having an input coupled for receiving the second prescribed potential, and a logic gate having a first input coupled to an output of said first logic gate and a second input coupled for receiving the first prescribed potential.

11. The protection device of claim 10, wherein the first signal is at least one of an internal signal, an external signal and a signal from the first electrode of said switch.

12. The protection device of claim 10, wherein said logic gate is a NAND gate.

13. The protection device of claim 10, wherein said switch is a PMOS transistor including a control gate coupled to an output of the logic gate, and the first and second prescribed potentials are source and ground voltages, respectively.

14. The protection circuit of claim 10, wherein said protection device comprises a first diode coupled between the first prescribed potential and the node to prevent the positive electro-static discharge.

15. The protection circuit of claim 14, wherein said first diode comprises a PMOS transistor having a control electrode and first and second electrodes, the control and first electrodes of said PMOS transistor being coupled to the first prescribed potential of a source voltage and the second electrode being coupled to the node.

16. The protection circuit of claim 10, wherein said protection device comprises a second diode coupled between the second prescribed potential and the node to prevent the negative electro-static discharge.

17. The protection circuit of claim 16, wherein said second diode comprises an NMOS transistor having a control electrode and first and second electrodes, the control and first electrodes being coupled to the second prescribed potential of a ground voltage and the second electrode being coupled to the node.

18. The protection device of claim 10, wherein said switch is a transistor including a control electrode coupled to the control circuit.

19. The protection device of claim 18, wherein said control circuit is responsive to the first and second prescribed potentials to turn on or off said transistor.

20. The protection device of claim 19, wherein said control circuit turns on said transistor when the first and second prescribed potentials are high and low voltages, respectively.

* * * * *